(12) United States Patent
Kuzuhara (10) Patent No.: US 12,089,375 B2
(45) Date of Patent: Sep. 10, 2024

(54) CIRCUIT ASSEMBLY WITH BUS BAR AND ELASTIC HEAT CONDUCTIVE MEMBER

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Fumihiro Kuzuhara, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 241 days.

(21) Appl. No.: 17/773,994

(22) PCT Filed: Nov. 10, 2020

(86) PCT No.: PCT/JP2020/041865
§ 371 (c)(1),
(2) Date: May 3, 2022

(87) PCT Pub. No.: WO2021/100544
PCT Pub. Date: May 27, 2021

(65) Prior Publication Data
US 2022/0394873 A1 Dec. 8, 2022

(30) Foreign Application Priority Data

Nov. 18, 2019 (JP) ................................ 2019-207977

(51) Int. Cl.
*H05K 7/20* (2006.01)
*H01H 1/62* (2006.01)
(Continued)

(52) U.S. Cl.
CPC ......... *H05K 7/2039* (2013.01); *H01H 50/047* (2013.01); *H01H 50/12* (2013.01);
(Continued)

(58) Field of Classification Search
CPC ..... H05K 2201/10; H05K 2201/10227; H05K 2201/10272; H01R 4/00; H01R 4/4809;
(Continued)

(56) References Cited

U.S. PATENT DOCUMENTS

2019/0287933 A1* 9/2019 Fujii ..................... H01L 25/115
2019/0297720 A1* 9/2019 Fujimura ............. H05K 1/0204
(Continued)

FOREIGN PATENT DOCUMENTS

| JP | 2014-103168 | 6/2014 |
| JP | 2018-093711 | 6/2018 |
| JP | 2020-184564 | 11/2020 |

OTHER PUBLICATIONS

International Search Report issued in International Bureau of Wipo Patent Application No. PCT/JP2020/041865, dated Feb. 2, 2021, along with an English translation thereof.

*Primary Examiner* — Zachary Pape
*Assistant Examiner* — Steven Ngo
(74) *Attorney, Agent, or Firm* — GREENBLUM & BERNSTEIN, P.L.C.

(57) ABSTRACT

The present disclosure provides a circuit assembly that has a novel structure, with which it is possible to prevent the occurrence of a problem caused by an excessive repulsive force of a heat conductive member by controlling the repulsive force of the heat conductive member. A circuit assembly includes: a heat generation component; bus bars that are connected to connecting portions of the heat generation component; an insulating base member that holds the heat generation component and the bus bars; and an elastic (Continued)

heat conductive member that is in thermal contact with the bus bars. The bus bars press the heat conductive member in a mounting direction in which the bus bars are mounted on the base member. As a result of the bus bars abutting against bus bar positioning portions provided on the base member, the positions of the bus bars in the mounting direction are defined.

5 Claims, 5 Drawing Sheets (51) Int. Cl.
| | | |
|---|---|---|
| *H01H 9/52* | (2006.01) | |
| *H01H 50/04* | (2006.01) | |
| *H01H 50/12* | (2006.01) | |
| *H01H 50/14* | (2006.01) | |
| *H01R 4/34* | (2006.01) | |
| *H01R 25/14* | (2006.01) | |
| *H05K 7/06* | (2006.01) | |

(52) U.S. Cl.
CPC ........... *H01H 50/14* (2013.01); *H01R 25/142* (2013.01); *H01R 25/145* (2013.01); *H05K 7/06* (2013.01); *H01H 1/62* (2013.01); *H01H 9/52* (2013.01); *H01R 4/34* (2013.01); *H05K 7/20472* (2013.01)

(58) Field of Classification Search
CPC .......... H01R 4/4846; H01R 9/22–2691; H01H 1/58; H01H 1/5855; H01H 37/32; H01H 37/34; H01H 45/00; H01H 45/02; H01H 45/04; H01H 45/12; H01H 50/12; H01H 50/54; H01H 9/52; H01H 9/20; H01H 9/26; H01H 33/66; H01H 33/6606; H01H 2033/6613; H01H 85/02; H01H 85/47; H01H 85/20; H01H 85/205; H01H 2085/2055; H01H 2009/267
See application file for complete search history.

(56) References Cited

U.S. PATENT DOCUMENTS

| | | | |
|---|---|---|---|
| 2019/0318892 A1* | 10/2019 | Ikejiri ............... | H01M 10/6553 |
| 2020/0136326 A1* | 4/2020 | Rai ........................ | H01H 50/12 |
| 2020/0196486 A1* | 6/2020 | Won ................... | H05K 7/14329 |
| 2020/0234905 A1* | 7/2020 | Shirakata ............ | H01L 23/3135 |

* cited by examiner

CIRCUIT ASSEMBLY WITH BUS BAR AND ELASTIC HEAT CONDUCTIVE MEMBER

TECHNICAL FIELD

The present disclosure relates to a circuit assembly that includes a heat generation component.

BACKGROUND ART

Conventionally, a vehicle is equipped with a circuit assembly that includes a heat generation component such as a relay. For example, Patent Document 1 discloses a circuit assembly that includes a metal battery case for housing a relay. This circuit assembly includes a relay that serves as a heat generation component, a first bus bar that is connected to the relay, a heat conductive member that is disposed between the relay and the first bus bar, and a heat conductive member that is disposed between the first bus bar and the battery case. As a result of one of the heat conductive members being disposed between the first bus bar and the relay and the other heat conductive member being disposed between the first bus bar and the battery case, the heat conductive members constitute a heat transfer path through which heat generated by the relay is transferred from the relay to the first bus bar, and then transferred from the first bus bar to the battery case. With this configuration, the heat dissipation efficiency of the relay is improved.

CITATION LIST

Patent Document

Patent Document 1: JP 2018-93711A

SUMMARY OF INVENTION

Technical Problem

A heat conductive member is made of a synthetic resin that is elastic, can be formed in any shape such as a sheet, and has a heat conductivity higher than that of the air, such as, for example, a heat dissipation gap filler, a heat conductive grease, or a heat-conductive silicone rubber. The heat conductive member is disposed between members and appropriately compressed, and thereby comes into a tight contact with the members. Accordingly, the heat conductive efficiency can be enhanced. However, there may be a case where the heat conductive member is compressed excessively due to manufacturing tolerances of the members that constitute the circuit assembly and assembly tolerances when assembling the members. When the heat conductive member is compressed excessively, a large stress acts between members due to the repulsive force of the heat conductive member, which may cause damage to the members and the like.

Accordingly, the present disclosure discloses a circuit assembly that has a novel structure, with which it is possible to prevent the occurrence of a problem caused by an excessive repulsive force of a heat conductive member by controlling the repulsive force of the heat conductive member.

Solution to Problem

A circuit assembly according to the present disclosure is a circuit assembly including: a heat generation component; bus bars that are connected to connecting portions of the heat generation component; an insulating base member that holds the heat generation component and the bus bars; and an elastic heat conductive member that is in thermal contact with the bus bars, wherein the bus bars press the heat conductive member in a mounting direction in which the bus bars are mounted on the base member, and the positions of the bus bars in the mounting direction are defined as a result of the bus bars abutting against bus bar positioning portions provided on the base member.

Advantageous Effects of Invention

According to the present disclosure, it is possible to prevent the occurrence of a problem caused by an excessive repulsive force of a heat conductive member by controlling the repulsive force of the heat conductive member.

DESCRIPTION OF EMBODIMENT

Description of Embodiment of the Present Disclosure

First, embodiments according to the present invention will be listed and described.

(1) A circuit assembly according to the present disclosure is a circuit assembly including: a heat generation component; bus bars that are connected to connecting portions of the heat generation component; an insulating base member that holds the heat generation component and the bus bars; and an elastic heat conductive member that is in thermal contact with the bus bars, wherein the bus bars press the heat conductive member in a mounting direction in which the bus bars are mounted on the base member, and the positions of the bus bars in the mounting direction are defined as a result of the bus bars abutting against bus bar positioning portions provided on the base member.

According to the present disclosure, the bus bars are configured to press the heat conductive member in the mounting direction in which the bus bars are mounted on the base member and abut against the bus bar positioning portions provided on the base member, and thereby the positions of the bus bars in the mounting direction are defined. With this configuration, the positions of the bus bars with respect to the base member in the mounting direction that determine the amount of compression of the heat conductive member by the bus bars are reliably defined as a result of the bus bars abutting against the bus bar positioning portions provided on the base member, and the heat conductive member is prevented from being compressed excessively by the bus bars. Also, the positions of the bus bars with respect to the base member in the mounting direction are defined as a result of the bus bars abutting against the bus bar positioning portions, and thus a problem caused by the heat conductive member being compressed excessively due to overlapping tolerances of a large number of members can also be overcome. As a result, excellent heat dissipation properties can be achieved in a stable manner by compressing the heat conductive member at a desired compression ratio.

The heat conductive member may be mounted on the base member and interposed between the base member and the bus bars, or may be in thermal contact with a member other than the base member via an opening formed in the base member and interposed between the member and the bus bars.

The bus bars are connected to the connecting portions of the heat generation component, and thus heat generated by the heat generation component is favorably transferred. The bus bars that are connected to the connecting portions of the heat generation component may be those used as conductive members or those used for heat dissipation.

(2) It is preferable that fixing portions for fixing the heat generation component are provided on the base member in a protruding manner, protruding end faces of the fixing portions are used as one of the bus bar positioning portions, and the bus bars include abutting portions that are mounted on the protruding end faces of the fixing portions and fixed together with the heat generation component. The reason is that, with the fixing portions for fixing the heat generation component that are provided on the base member, the bus bar positioning portion can be provided with a good space efficiency. Also, the fixing structure for fixing the heat generation component and the bus bars to the base member can be used in a shared manner, and it is therefore possible to add a control structure for controlling the amount of compression of the heat conductive member by the bus bars without increasing the number of components and the number of assembling steps.

(3) It is preferable that the bus bars each include: a first connecting portion that is connected to one of the connecting portions of the heat generation component; and a second connecting portion that is spaced apart from the first connecting portion and is electrically connected to another member, the bus bars each include, at an intermediate portion between the first connecting portion and the second connecting portion, a pressing portion that presses the heat conductive member, and abutting portions that abut against the bus bar positioning portions are provided on the first connecting portion side and the second connecting portion side of the pressing portion. The reason is that the bus bars used for electric connection to the heat generation component are used for heat dissipation, and thus the number of components can be reduced. Furthermore, the pressing portion is provided at an intermediate portion of each of the bus bars for electrical connection that are relatively long, and abutting portions that abut against the bus bar positioning portions are provided on the first connecting portion side and the second connecting portion side of the pressing portion. Accordingly, it is possible to reliably define the positions of the bus bars in the mounting direction on both sides of the pressing portion, and achieve a desired compression state of the heat conductive member in a stable manner.

(4) It is preferable that the heat conductive member is mounted on the base member and interposed between the base member and the bus bars, and a restricting wall for restricting deformation of the heat conductive member is provided in the vicinity of the heat conductive member in the base member. The reason is that, by providing the restriction wall in the vicinity of the heat conductive member, it is possible to prevent local deformation of the heat conductive member and bring the heat conductive member into a relatively uniform compression state. In order to achieve a more uniform compression state, the restricting wall is preferably provided to surround the entire perimeter of the heat conductive member.

(5) In the configuration (4) described above, it is preferable that the heat generation component is a relay, and the restricting wall includes an insulation wall that is provided in a protruding manner on the base member at a position between one of the bus bars that is connected to a positive connecting portion of the relay and the other bus bar that is connected to a negative connecting portion of the relay. The reason is that the restricting wall can be formed using the insulation wall that is provided on the base member in advance, and the number of components can be further reduced.

DETAILED DESCRIPTION OF EMBODIMENT OF THE PRESENT DISCLOSURE

A specific example of a circuit assembly according to the present disclosure will be described below with reference to the drawings. It is to be noted that the present disclosure is not limited to the example given below, and the scope of the present disclosure is indicated by the appended claims, and all changes that come within the meaning and range of equivalency of the claims are intended to be embraced within the scope of the present disclosure.

Embodiment 1

Hereinafter, Embodiment 1 according to the present disclosure will be described with reference to FIGS. 1 to 5. A circuit assembly 10 is attached to, for example, the frame of a battery pack (not shown in the diagrams) that is mounted in a vehicle such as an electric vehicle or a hybrid vehicle, and controls the power of the battery pack. The circuit assembly 10 can be disposed in any orientation. In the description given below, the term "upper direction" refers to a direction extending upward in FIGS. 1, 2, 4, and 5, and the term "lower direction" refers to a direction extending downward in FIGS. 1, 2, 4, and 5. Likewise, the term "front direction" refers to a direction toward the bottom of FIG. 3, the term "rear direction" refers to a direction toward the top of FIG. 3, the term "lengthwise direction" refers to the up-down direction in FIG. 3, and the term "width direction" refers to the left-right direction in FIG. 3. Furthermore, when there are a plurality of identical members, only part of the members may be indicated by reference numeral, and the reference numeral may be omitted for the other members.

Circuit Assembly 10

Figure 1:
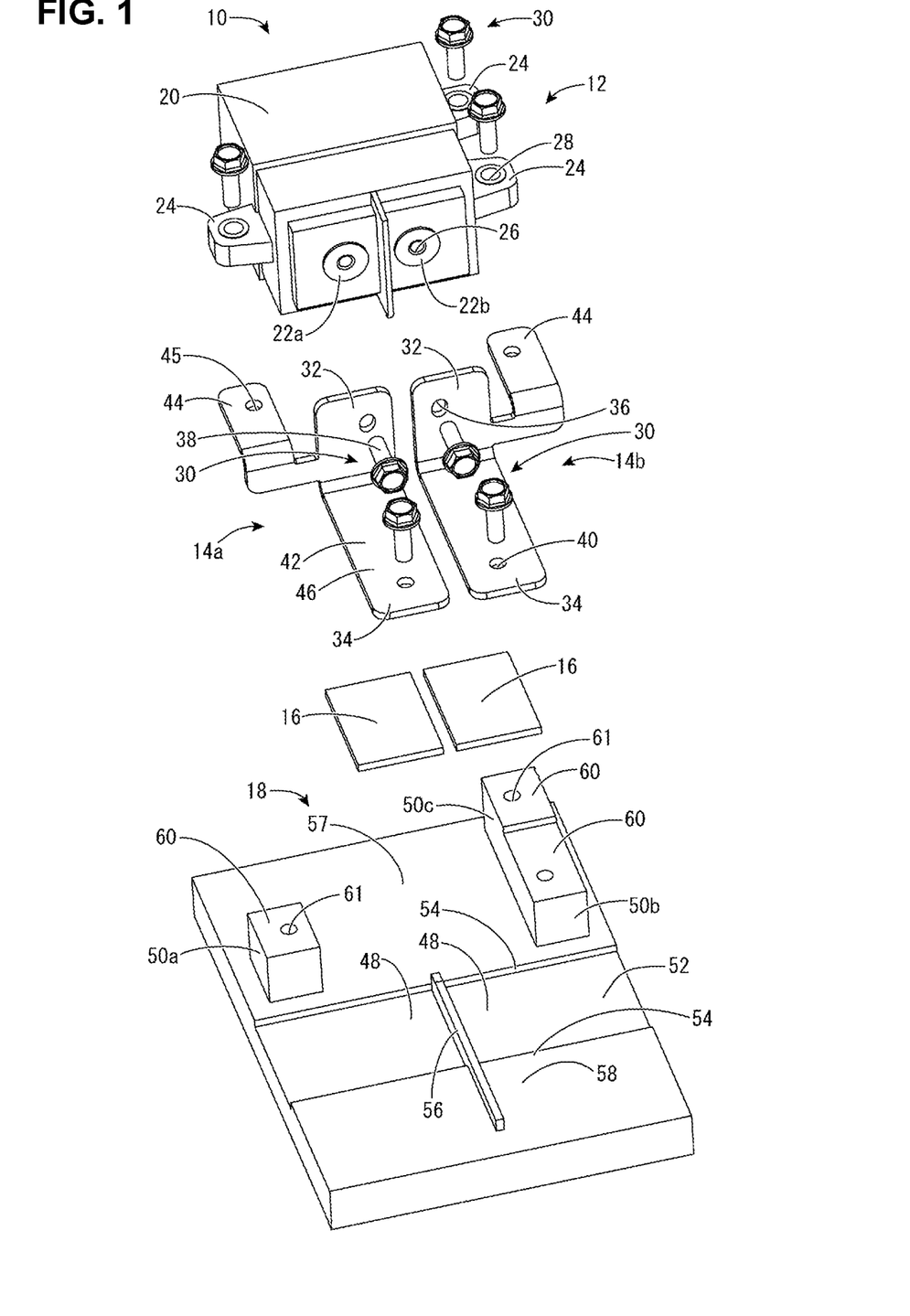
FIG. 1 is an exploded perspective view of a circuit assembly according to Embodiment 1 of the present disclosure.

As shown in FIG. 1, the circuit assembly 10 includes a relay 12 that is a heat generation component, a pair of bus bars 14a and 14b, a pair of heat conductive sheets 16 that constitute an elastic heat conductive member, and a base member 18.

Relay 12

The relay 12 is a mechanical relay, and is turned on and off by a control circuit (not shown). As shown in FIGS. 1 to 5, the relay 12 includes a relay main body 20 in the form of a block, a pair of annular connecting portions 22a and 22b, and a plurality of (three in the present embodiment) leg portions 24. The relay main body 20 is internally provided with a contact portion and a coil portion (not shown). On the front surface of the relay main body 20, the pair of connecting portions 22a and 22b are provided side by side in the width direction (the left-right direction in FIGS. 3 and 4). The pair of connecting portions 22a and 22b generate heat as a result of an electric current flowing between the pair of connecting portions 22a and 22b via the contact portion of the relay main body 20 and heat generated at the contact portion being transferred. Each of the connecting portions 22a and 22b includes a bottomed cylindrical bolt insertion hole 26 that extends in the rear direction. The leg portions 24 are formed in a flat plate shape that extends outward, with two leg portions 24 being provided on one side surface of the relay main body 20 in the width direction (the right side in FIG. 3), and one leg portion 24 being provided on the other side surface of the relay main body 20 in the width direction (the left side in FIG. 3). Each of the leg portions 24 includes a bolt insertion hole 28 that extends through the leg portion 24 in the up-down direction. As a result of bolts 30 being inserted into the bolt insertion holes 28, and the leg portions 24 being fastened to fixing portions 50a, 50b, and 50c that are provided in a protruding manner on the base member 18, which will be described later, the relay 12 is fixed to the base member 18.

Bus Bars 14a and 14b

Figure 2:
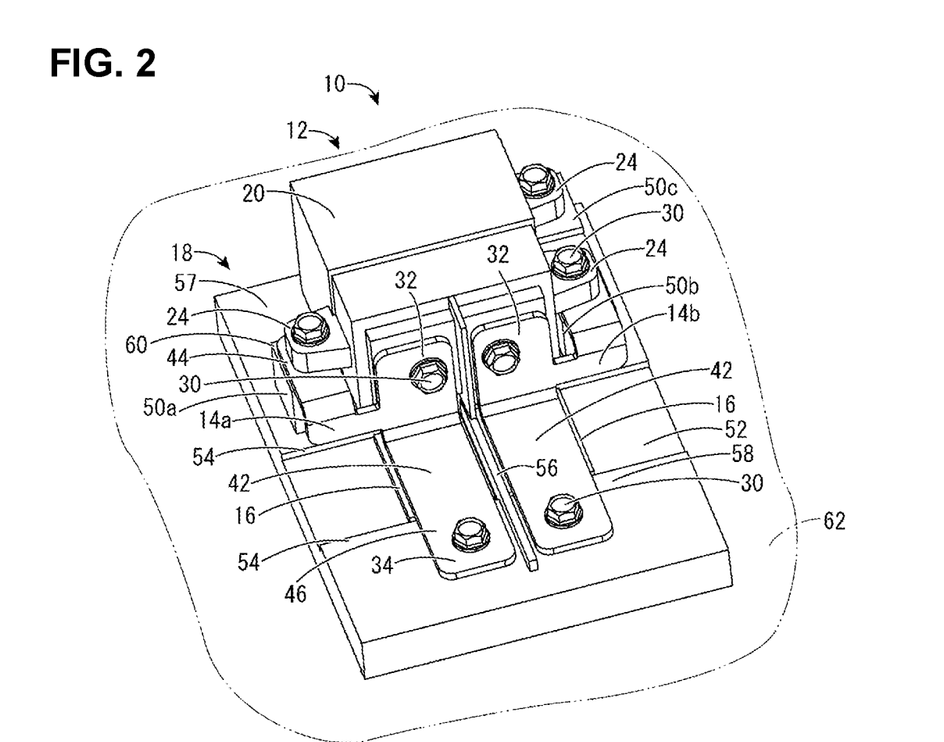
FIG. 2 is an overall perspective view of the circuit assembly shown in FIG. 1.
Figure 3:
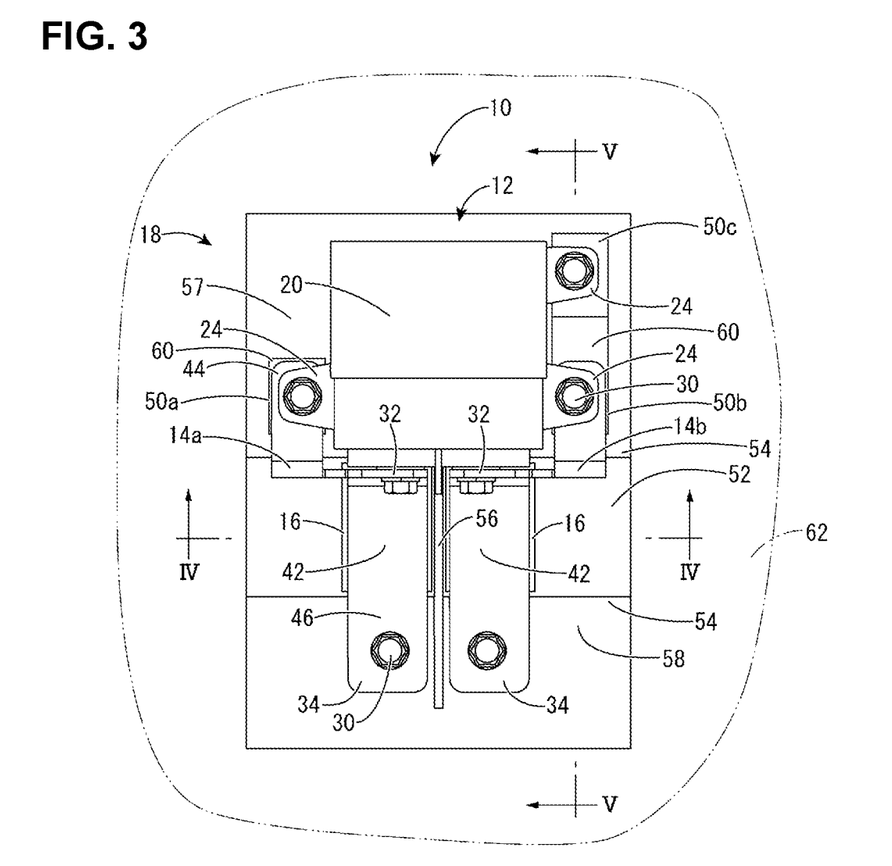
FIG. 3 is a plan view of the circuit assembly shown in FIG. 2.
Figure 4:
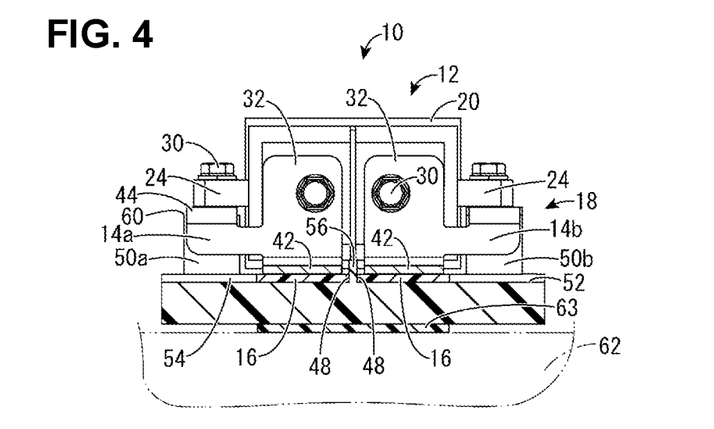
FIG. 4 is a cross sectional view taken along the line IV-IV shown in FIG. 3.

Each of the pair of bus bars 14a and 14b is formed by processing a conductive metal plate. As shown in FIGS. 1 and 2, for example, each of the bus bars 14a and 14b is formed by being bent into an L shape, with one end being defined as a first connecting portion 32 and the other end being defined as a second connecting portion 34. The first connecting portions 32 are provided extending in the up-down direction on the front side surfaces of the connecting portions 22a and 22b of the relay 12, and each first connecting portion 32 includes a bolt insertion hole 36 that extends through the first connecting portion 32 in the front-rear direction that is a thickness direction. The bolt insertion holes 36 are long holes that are elongated in the up-down direction that is an assembly direction in which the relay 12 and the bus bars 14a and 14b are assembled to the base member 18. The bus bars 14a and 14b are electrically and thermally connected to the connecting portions 22a and 22b of the relay 12 as a result of shaft portions 38 of bolts 30 being inserted into the bolt insertion holes 36 of the first connecting portions 32 and screwed into the bolt insertion holes 26 of the connecting portions 22a and 22b. The second connecting portions 34 are provided extending in the front direction from the lower end portions of the first connecting portions 32, and each second connecting portion 34 includes a bolt insertion hole 40 that extends through the second connecting portion 34 in the up-down direction that is the thickness direction. In each of the bus bars 14a and 14b, as a result of a terminal of another member (not shown) being placed on the second connecting portion 34 in a superimposed manner and a bolt 30 being inserted into the bolt insertion hole 40 and fastened, the second connecting portion 34 and the terminal of the member are electrically connected. In Embodiment 1, the pair of bus bars 14a and 14b are configured such that the bus bar 14a is connected to the positive connecting portion 22a of the relay 12, and the bus bar 14b is connected to the negative connecting portion 22b of the relay 12.

Also, each of the bus bars 14a and 14b includes a pressing portion 42 at an intermediate portion between the first connecting portion 32 and the second connecting portion 34. The pressing portion 42 is formed in a rectangular flat plate shape that extends from the lower end portion of the first connecting portion 32 toward the second connecting portion 34 in the front direction. Furthermore, each of the bus bars 14a and 14b includes a portion that protrudes in a rectangular flat plate shape from the lower end portion of the first connecting portion 32 in a direction away from the bus bar 14a or 14b and being bent in an L shape in the rear direction. With a protruding end portion of the portion, a first abutting portion 44 is formed. The first abutting portion 44 includes a bolt insertion hole 45 that extends through the first abutting portion 44 in the up-down direction that is the thickness direction. The first abutting portions 44 are mounted on protruding end faces 60 of fixing portions 50a and 50b that are provided on the base member 18 and constitute a bus bar positioning portion, which will be described later, and fixed together with the leg portions 24 of the relay 12. That is, the first abutting portions 44 that abut against the protruding end faces 60 of the fixing portions 50a and 50b that constitute a bus bar positioning portion, which will be described later, are provided on the first connecting portion 32 side relative to the pressing portions 42 of the bus bars 14a and 14b. In addition, in each of the bus bars 14a and 14b, the second abutting portion 46 is provided on the second connecting portion 34 side relative to the pressing portion 42. The second abutting portions 46 are mounted on a front side wall 54 of heat conductive sheet housing portions 48 of the base member 18, the front side wall 54 constituting a bus bar positioning portion, which will be described later.

Base Member 18

As shown in FIG. 1, the base member 18 is configured to hold, for example, the relay 12, the pair of bus bars 14a and 14b, and the pair of heat conductive sheets 16 as a result of these members being assembled from the upper direction. The base member 18 has a flat rectangular parallelepiped shape that extends in the lengthwise direction as a whole, and is made using an insulating synthetic resin. The base member 18 includes a pair of heat conductive sheet housing portions 48 and three fixing portions 50a, 50b, and 50c.

Heat Conductive Sheet Housing Portion 48

In a region on the front side of a center portion of the base member 18, the pair of heat conductive sheet housing portions 48 are formed in a recess 52 that is an upward opening extending in the width direction so as to extend over the entire width of the base member 18 in the width direction (the left-right direction in FIG. 1) while having a predetermined depth dimension. A pair of side walls 54 are formed on opposing end edge portions of the recess 52 in the lengthwise direction. Also, at a center portion of the recess 52 in the width direction, a flat plate-shaped insulation wall 56 is formed, the insulation wall 56 extending in the front direction from the rear end portion of the recess 52 (on the upper direction side in FIG. 1) over the front end portion of the recess 52. In a state in which the pair of bus bars 14a and 14b are mounted on the base member 18, the insulation wall 56 is provided in a protruding manner between the pair of bus bars 14a and 14b, and also protrudes upward from an upper surface 58 of the base member 18. As a result of the recess 52 being divided by the insulation wall 56, the pair of heat conductive sheet housing portions 48 are formed. The pair of heat conductive sheets 16 are disposed on the pair of heat conductive sheet housing portions 48 such that the pair of heat conductive sheets 16 come close to the insulation wall 56. Accordingly, three out of four sides of each of the pair of heat conductive sheets 16 are surrounded by the pair of side walls 54 of the recess 52 and the insulation wall 56. As a result of each of the heat conductive sheets 16 being surrounded by the pair of side walls 54 and the insulation wall 56, deformation of the heat conductive sheets 16 caused as a result of the heat conductive sheets 16 being pressed by the pressing portions 42 of the bus bars 14a and 14b, which will be described later, is restricted. That is, a restricting wall that restricts the deformation of the heat conductive sheets 16 is formed by the pair of side walls 54 and the insulation wall 56.

Heat Conductive Sheet 16

The heat conductive sheets 16 that constitute an elastic heat conductive member transfer heat of the bus bars 14a and 14b to the base member 18. The heat conductive sheets 16 are formed in a sheet shape that is flat in the up-down direction, and made using a synthetic resin that has a heat conductivity higher than that of the air. Specifically, a silicone resin, a non-silicone acrylic resin or ceramic resin, or the like can be used. More specifically, for example, a heat dissipation gap filler, a heat conductive grease, a heat-conductive silicone rubber, or the like that is made of a silicone resin can be used. The heat conductive sheets 16 are flexible and elastic, and are capable of elastic deformation such that the thickness dimension varies according to the force applied in the up-down direction. In the present embodiment, the heat conductive sheets 16 are used as a heat conductive member. However, the configuration is not limited thereto, and an elastic heat conductive member of any shape can be used.

Fixing Portions 50a, 50b, and 50c

Figure 5:
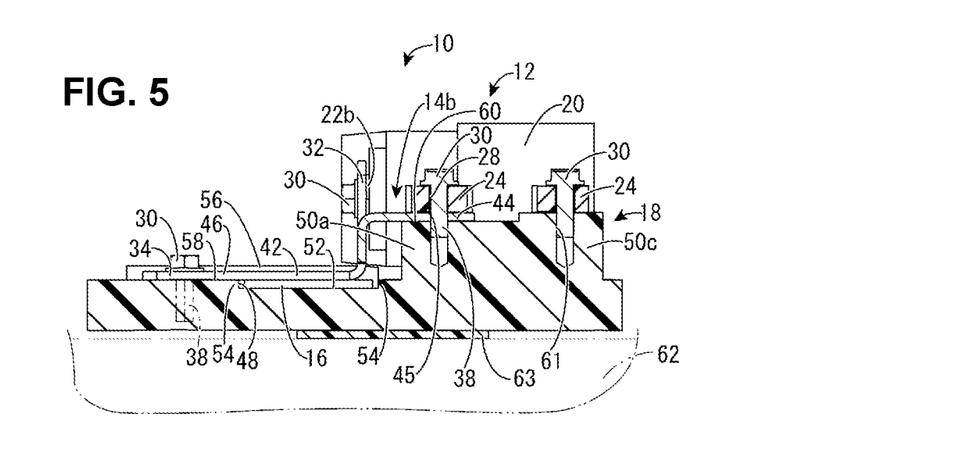
FIG. 5 is a cross sectional view taken along the line V-V shown in FIG. 3.

The fixing portions 50a, 50b, and 50c are disposed in a region on the rear side of the center portion of the base member 18, with the fixing portion 50a protruding upward from an upper surface 57 on one side in the width direction (the left side in FIG. 1) in a substantially rectangular cross sectional shape, and the fixing portions 50b and 50c protruding upward from the upper surface 57 on the other side in the width direction (the right side in FIG. 1) in a substantially rectangular cross sectional shape. In each of the protruding end faces 60 of the fixing portions 50a, 50b, and 50c, a bottomed cylindrical bolt insertion hole 61 that has an upward opening is formed. As shown in FIG. 5, for example, the protruding end faces 60 of the fixing portions 50a and 50b are formed to be lower than the protruding end face 60 of the fixing portion 50c by an amount corresponding to the thickness of the bus bars 14a and 14b.

Bracket 62

The base member 18 of the circuit assembly 10 is assembled to a bracket 62 that is attached to the frame of a battery pack (not shown). In FIGS. 2 to 5, the bracket 62 to which the circuit assembly 10 is attached is indicated by an imaginary line. The bracket 62 is made using a heat conductive metal. A heat conductive sheet 63 is provided between the surface of the bracket 62 and the bottom surface of the base member 18 in a superimposed manner and fixed with a fixture (not shown). The heat conductive sheet 63 thereby comes into a tight contact with the bottom surface of the base member 18 and the surface of the bracket 62.

Step of Assembling Circuit Assembly 10

Next, an example of a step of assembling the circuit assembly 10 will be described. The step of assembling the circuit assembly 10 is not limited to the description given below.

First, a base member 18 is prepared. Next, two heat conductive sheets 16 are cut into a predetermined shape using a known method such as Thompson die cutting processing, and attached to predetermined positions in a pair of heat conductive sheet housing portions 48 of the base member 18.

On the base member 18 to which the heat conductive sheets 16 have been attached, a pair of bus bars 14a and 14b are mounted from above, with the pair of bus bars 14a and 14b being positioned to extend in the lengthwise direction. Furthermore, a relay 12 is mounted at a predetermined position on the base member 18. In this state, the first abutting portions 44 of the pair of bus bars 14a and 14b are fastened with bolts to the protruding end faces 60 of the fixing portions 50a and 50b of the base member 18 together with two leg portions 24 of the relay 12, and one remaining leg portion 24 of the relay 12 is fastened with a bolt to the protruding end face 60 of the fixing portion 50c of the base member 18. Next, the first connecting portions 32 of the bus bars 14a and 14b are fastened with bolts to the connecting portions 22a and 22b of the relay 12. Here, the bolt insertion holes 36 formed in the first connecting portions 32 are formed as long holes that are elongated in the up-down direction, and thus tolerances in the up-down direction of the connecting portions 22a and 22b of the relay 12 for the pair of bus bars 14a and 14b are favorably absorbed. Finally, the second connecting portions 34 of the pair of bus bars 14a and 14b are superimposed on a terminal of another member (not shown) and fastened with bolts. As a result, the bus bars 14a and 14b are electrically connected to the member. In this way, a circuit assembly 10 is obtained.

In this state, the pressing portions 42 of the bus bars 14a and 14b press the heat conductive sheets 16 in the up-down direction that is a mounting direction in which the bus bars 14a and 14b are mounted on the base member 18. More specifically, the heat conductive sheets 16 are mounted on the heat conductive sheet housing portions 48 that are formed in the base member 18, and interposed between the bus bars 14a and 14b and the base member 18. The heat conductive sheets 16 are in thermal contact with the bus bars 14a and 14b and the base member 18, and thus heat generated by the relay 12 is transferred from the connecting portions 22a and 22b to the bus bars 14a and 14b, and the heat is dissipated to the base member 18 via the heat conductive sheets 16. Also, the first abutting portions 44 of the bus bars 14a and 14b are mounted on the protruding end faces 60 of the fixing portions 50a and 50b of the base member 18 and fixed together with two leg portions 24 of the relay 12, and the second abutting portions 46 are mounted on the front side wall 54 of the heat conductive sheet housing portions 48 of the base member 18. That is, as a result of the bus bars 14a and 14b abutting against the protruding end faces 60 of the fixing portions 50a and 50b that constitute a constitute bus bar positioning portion, and the upper surface 58 of the front side wall 54 of the heat conductive sheet housing portions 48 that are formed in the base member 18, the positions of the bus bars 14a and 14b in the mounting direction are defined.

Next, the base member 18 of the circuit assembly 10 is fixed with a fixture (not shown) to the surface of a bracket 62, with a heat conductive sheet 63 interposed therebetween. As a result, a heat transfer path is formed through which heat generated by the relay 12 and transferred to the base member 18 via the bus bars 14a and 14b and the heat conductive sheets 16 is transferred to the bracket 62 via the heat conductive sheet 63 and to the frame of the battery pack. Accordingly, the heat dissipation of the relay 12 is efficiently achieved.

With the circuit assembly 10 according to the present disclosure configured as described above, the pressing portions 42 of the bus bars 14a and 14b press the heat conductive sheets 16 in the up-down direction. In addition, as a result of the bus bars 14a and 14b abutting against the protruding end faces 60 of the fixing portions 50a and 50b that constitute a bus bar positioning portion and the upper surface 58 of the front side wall 54 of the heat conductive sheet housing portions 48 that are provided in the base member 18, the positions of the bus bars 14a and 14b in the mounting direction are defined. Accordingly, the positions of the bus bars 14a and 14b with respect to the base member 18 in the mounting direction that determine the amount of compression of the heat conductive sheets 16 by the bus bars 14a and 14b are reliably defined by the protruding end faces 60 of the fixing portions 50a and 50b and the upper surface 58 of the front side wall 54 of the heat conductive sheet housing portions 48 that are provided in the base member 18. This configuration prevents the heat conductive sheets 16 from being compressed excessively by the bus bars 14a and 14b. Also, all of the bus bar positioning portions are formed by structural elements of the base member 18 on which the bus bars 14a and 14b are directly mounted, and thus a problem caused by the heat conductive sheets 16 being compressed excessively due to overlapping tolerances of a large number of members can also be favorably overcome. Accordingly, excellent heat dissipation properties can be achieved in a stable manner by compressing the heat conductive sheets 16 at a desired compression ratio. In addition, a bus bar positioning portion is formed by existing fixing portions 50a and 50b for fixing the relay 12 that are provided on the base member 18, and thus the bus bar positioning portion can be formed with a good space efficiency without increasing the number of components and the number of assembling steps.

Also, the bus bars 14a and 14b that are conductive members for electric connection to other members of the relay 12 are used for heat dissipation, and thus the number of components can be reduced. In addition, the pressing portions 42 are provided at an intermediate portion of the bus bars 14a and 14b for electric connection that are relatively long, and the first abutting portions 44 and the second abutting portions 46 that abut against the bus bar positioning portions (the upper surface 58 and the protruding end faces 60 in the present embodiment) of the base member 18 are respectively provided on the first connecting portion 32 side and the second connecting portion 34 side of the pressing portion 42. With this configuration, it is possible to reliably cause the bus bars 14a and 14b to abut against the bus bar positioning portions on both sides of the pressing portion 42, and achieve a desired compression state of the heat conductive sheets 16 in a stable manner.

In addition, the deformation of each heat conductive sheet 16 is restricted by the pair of side walls 54 and the insulation wall 56 of the base member 18 that surround the heat conductive sheet 16. Accordingly, it is possible to prevent local deformation of the heat conductive sheets 16, and bring the heat conductive sheets 16 into a relatively uniform compression state. Furthermore, the insulation wall 56 provided on the base member 18 in advance is used, and thus the number of components can be further reduced.

Other Embodiments

The techniques disclosed in the specification of the present application are not limited to the embodiments described above with reference to the drawings, and, for example, embodiments as described below are also encompassed in the technical scope of the techniques disclosed in the specification of the present application.

(1) In the embodiment given above, a heat transfer path is formed through which heat generated by the relay 12 is transferred from the connecting portions 22a and 22b to the bus bars 14a and 14b, then transferred to the base member 18 via the heat conductive sheets 16, and then transferred from the base member 18 to the bracket 62 via the heat conductive sheet 63. However, the configuration is not limited thereto. The bus bars 14a and 14b may be in thermal contact with the bracket 62 that is provided outside the circuit assembly 10 and the heat conductive sheets 16 that are attached to other arbitrary members via an opening portion formed in the base member 18, without the base member 18 and the heat conductive sheet 63 being interposed therebetween. Also, instead of or in addition to the heat conductive sheets 16 and 63, a heat dissipation gap filler, a heat conductive grease, or the like may be used as an elastic heat conductive member.

(2) Also, in the embodiment given above, the bus bars 14a and 14b are in thermal contact directly with the heat conductive sheets 16. However, the configuration is not limited thereto, and the bus bars 14a and 14b may be in thermal contact with the heat conductive sheets 16 via other members.

(3) In the embodiment given above, as an example, the bus bars 14a and 14b are used as conductive members. However, the configuration is not limited thereto, and bus bars for heat dissipation may be used as long as the bus bars can be connected to the connecting portions of the heat generation component.

Figure 6:
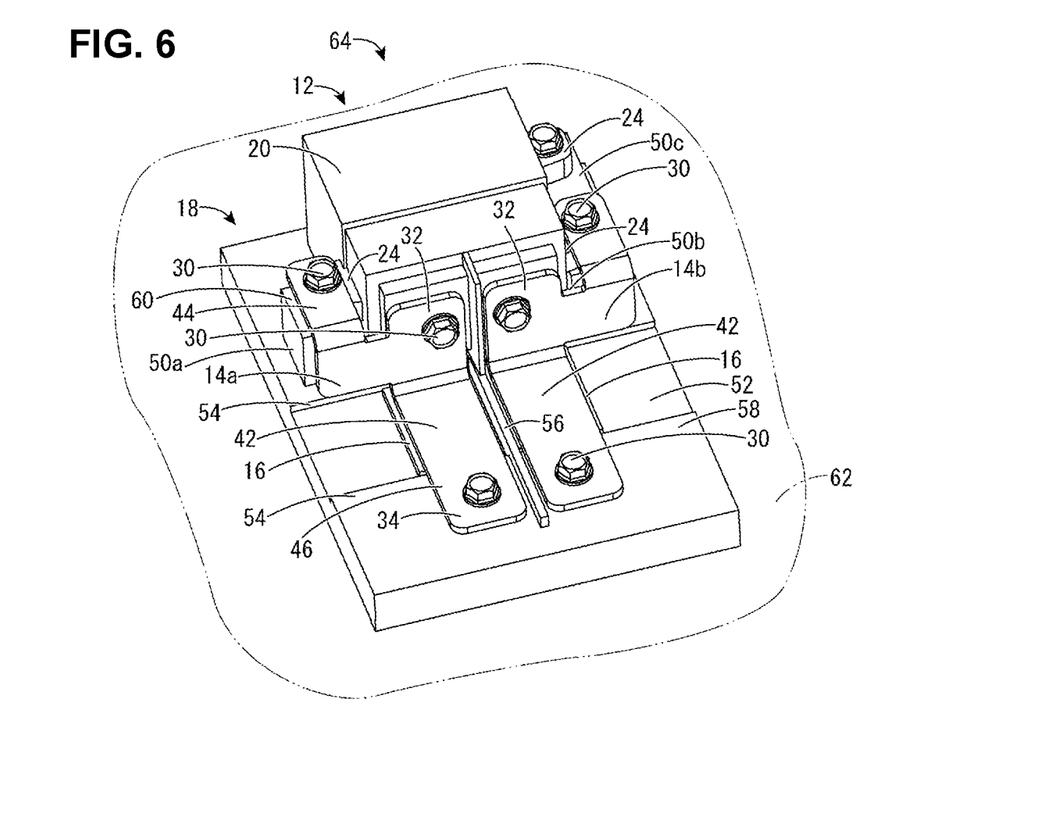
FIG. 6 is an overall perspective view of a circuit assembly according to Embodiment 2 of the present disclosure, and corresponds to FIG. 2.

(4) In the circuit assembly 10 according to the present disclosure, the abutting portions 44 and 44 of the bus bars 14a and 14b are mounted directly on the protruding end faces 60 of the fixing portions 50a and 50b for fixing the relay 12 that are provided on the base member 18 and constitute a bus bar positioning portion. However, the configuration is not limited thereto. For example, as in a circuit assembly 64 according to Embodiment 2 shown in FIGS. 6 and 7, the abutting portions 44 and 44 of the bus bars 14a and 14b may be mounted on the protruding end faces 60 of the fixing portions 50a and 50b via two leg portions 24 of the relay 12. In Embodiment 2 as well, only thin leg portions 24 are interposed, and thus overlapping tolerances of a large number of members are restricted as in Embodiment 1 described above, and thus the heat conductive sheets 16 are prevented from being compressed excessively by the bus bars 14a and 14b.

Figure 7:
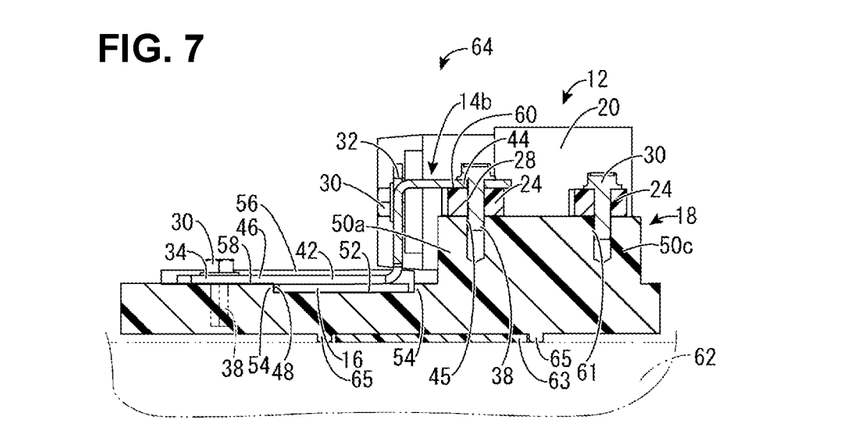
FIG. 7 is a cross sectional view of the circuit assembly shown in FIG. 6, and corresponds to FIG. 5.

In addition, as shown in FIG. 7, a restricting protrusion 65 that prevents excessive deformation of the heat conductive sheet 63 may be provided on the bottom surface of the base member 18 so as to suppress excessive compression of the heat conductive sheet 63 between the base member 18 and the bracket 62.

Figure 8:
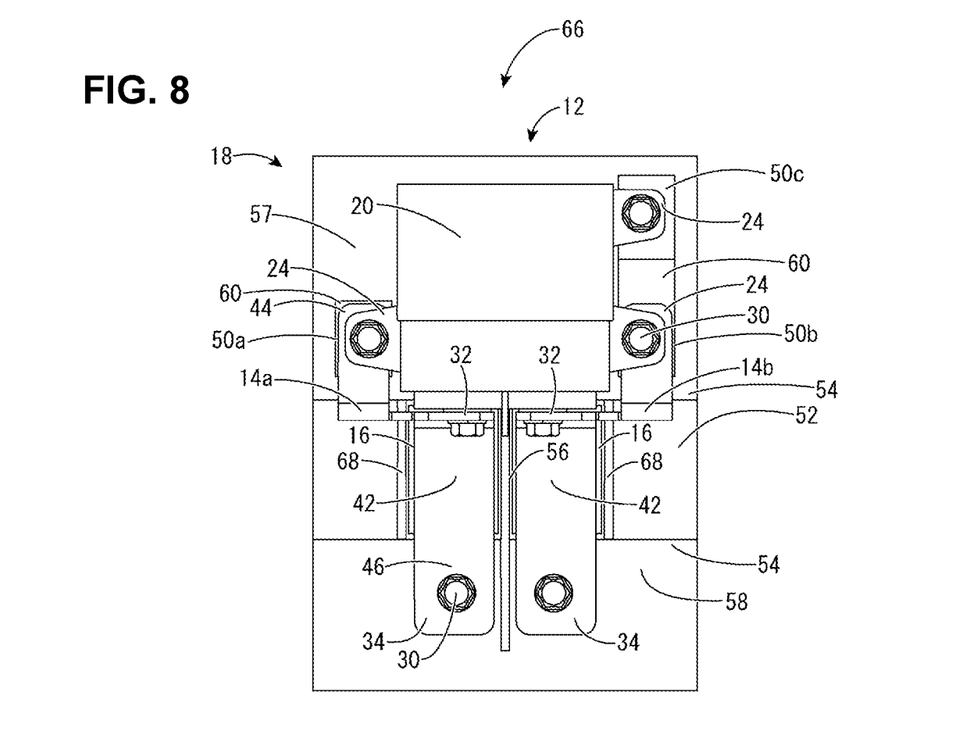
FIG. 8 is a plan view of a circuit assembly according to Embodiment 3 of the present disclosure, and corresponds to FIG. 3.

(5) In the circuit assembly 10 according to the present disclosure, three out of four sides of each of the pair of heat conductive sheets 16 are surrounded by the pair of side walls 54 of the recess 52 and the insulation wall 56. However, the configuration is not limited thereto. For example, as in a circuit assembly 66 according to Embodiment 3 shown in FIG. 8, all four sides of each of the pair of heat conductive sheets 16 may be surrounded by the pair of side walls 54 of the recess 52, the insulation wall 56, and a restricting wall 68. With this configuration, it is possible to further prevent local deformation of the heat conductive sheets 16 and bring the heat conductive sheets 16 into a uniform compression state. The restricting wall 68 is provided in a protruding manner with a height dimension that is greater than or equal to the depth dimension of the recess 52 so as to extend over the entire length of the recess 52 in the lengthwise direction.

LIST OF REFERENCE NUMERALS

10 Circuit assembly (Embodiment 1)
12 Relay (heat generation component)
14a Bus bar
14b Bus bar
16 Heat conductive sheet (heat conductive member)
18 Base member
20 Relay main body
22a Connecting portion
22b Connecting portion
24 Leg portion
26 Bolt insertion hole
28 Bolt insertion hole
30 Bolt
32 First connecting portion
34 Second connecting portion
36 Bolt insertion hole
38 Shaft portion
40 Bolt insertion hole
42 Pressing portion
44 First abutting portion
45 Bolt insertion hole
46 Second abutting portion
48 Heat conductive sheet housing portion
50a Fixing portion
50b Fixing portion
50c Fixing portion
52 Recess
54 Side wall (restricting wall)
56 Insulation wall (restricting wall)
57 Upper surface
58 Upper surface
60 Protruding end face
61 Bolt insertion hole
62 Bracket
63 Heat conductive sheet (heat conductive member)
64 Circuit assembly (Embodiment 2)
65 Restricting protrusion
66 Circuit assembly (Embodiment 3)
68 Restricting wall

The invention claimed is:

1. A circuit assembly comprising:
a heat generation component;
bus bars that are connected to connecting portions of the heat generation component;
an insulating base member that holds the heat generation component and the bus bars; and
an elastic heat conductive member that is in thermal contact with the bus bars,
wherein the bus bars press the heat conductive member in a mounting direction in which the bus bars are mounted on the base member,
the positions of the bus bars in the mounting direction are defined as a result of the bus bars abutting against bus bar positioning portions in the mounting direction, the bus bar positioning portions being provided on the base member,
fixing portions for fixing the heat generation component are provided on the base member in a protruding manner in the mounting direction,
a protruding end face of one of the fixing portions is used as one of the bus bar positioning portions, the protruding end face extending in a direction different from the mounting direction,
the bus bars each include abutting portions, including a first abutting portion that is mounted on and faces the protruding end face of the one of the fixing portions in the mounting direction, and
the first abutting portion is fixed to the protruding end face of the one of the fixing portions together with the heat generation component, such that the first abutting portion is interposed between the protruding end face and the heat generation component in the mounting direction.

2. The circuit assembly according to claim 1,
wherein the bus bars each include: a first connecting portion that is connected to one of the connecting portions of the heat generation component; and a second connecting portion that is spaced apart from the first connecting portion and is electrically connected to another member,
the bus bars each include, at an intermediate portion between the first connecting portion and the second connecting portion, a pressing portion that presses the heat conductive member, and
the bus bars each include the first abutting portion and a second abutting portion that abut against the bus bar positioning portions in the mounting direction and are respectively provided on a first connecting portion side of the pressing portion and a second connecting portion side of the pressing portion.

3. The circuit assembly according to claim 1,
wherein the heat conductive member is mounted on the base member and interposed between the base member and the bus bars, and
a restricting wall for restricting deformation of the heat conductive member is provided in the vicinity of the heat conductive member in the base member.

4. The circuit assembly according to claim 3,
wherein the heat generation component is a relay, and
the restricting wall includes an insulation wall that is provided in a protruding manner on the base member at a position between one of the bus bars that is connected to a positive connecting portion of the relay and the other bus bar that is connected to a negative connecting portion of the relay.

5. The circuit assembly according to claim 1, wherein the heat generation component includes a first bolt insertion hole, which is a though hole extending in the mounting direction, the first abutting portion includes a second bolt insertion hole extending through the first abutting portion in the mounting direction, the protruding end face includes a third bolt insertion hole, and a bolt is inserted into the first bolt insertion hole, the second bolt insertion hole and the third bolt insertion hole, and extends in the mounting direction to fasten the heat generation component, the abutting portion and the fixing portion.

* * * * *